(12) United States Patent
Chao

(10) Patent No.: US 8,415,745 B2
(45) Date of Patent: Apr. 9, 2013

(54) ESD PROTECTION DEVICE

(75) Inventor: Fang-Mei Chao, Taichung County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/094,557

(22) Filed: Apr. 26, 2011

(65) Prior Publication Data

US 2011/0198727 A1    Aug. 18, 2011

Related U.S. Application Data

(63) Continuation of application No. 12/469,164, filed on May 20, 2009, now Pat. No. 7,977,769.

(51) Int. Cl.
*H01L 23/62* (2006.01)

(52) U.S. Cl. ........ 257/355; 257/328; 257/341; 257/343; 257/345; 257/368; 438/202; 438/268; 438/301; 438/357

(58) Field of Classification Search .................. None
See application file for complete search history.

(56) References Cited

U.S. PATENT DOCUMENTS

| | | | | |
|---|---|---|---|---|
| 5,541,123 A | * | 7/1996 | Williams et al. | 438/202 |
| 2002/0050619 A1 | * | 5/2002 | Kawaguchi et al. | 257/368 |
| 2004/0110353 A1 | * | 6/2004 | Mallikarjunaswamy | 438/309 |
| 2008/0283914 A1 | * | 11/2008 | Fujii | 257/341 |
| 2010/0148265 A1 | | 6/2010 | Lin et al. | |

* cited by examiner

*Primary Examiner* — Kyoung Lee
(74) *Attorney, Agent, or Firm* — J.C. Patents

(57) ABSTRACT

An ESD protection device is described, which includes a P-body region, a P-type doped region, an N-type doped region and an N-sinker region. The P-body region is configured in a substrate. The P-type doped region is configured in the middle of the P-body region. The N-type doped region is configured in the P-body region and surrounds the P-type doped region. The N-sinker region is configured in the substrate and surrounds the P-body region.

20 Claims, 8 Drawing Sheets

ESD PROTECTION DEVICE

CROSS-REFERENCE TO RELATED APPLICATION

This application is a continuation application of and claims priority benefits of U.S. patent application Ser. No. 12/469,164, filed on May 20, 2009, now allowed. The entirety of the above-mentioned patent application is hereby incorporated by reference herein and made a part of this specification.

BACKGROUND OF THE INVENTION

1. Field of the Invention

The present invention relates to a semiconductor device, and in particular, to an electrostatic discharge (ESD) protection device.

2. Description of Related Art

ESD is the main factor of electrical overstress (EOS) which causes damage to most of electronic devices or systems. Such damage can result in the permanent damage of semiconductor devices and computer systems, so that the circuit function of integrated circuits (ICs) is affected and the operation of electronic products is abnormal. Accordingly, a number of methods have been developed to protect the semiconductor IC devices against possible ESD damages. The most common type of ESD protection is the incorporation of a specific hardware inside the IC package. A specially-designed ESD protection device set up between an input pad and an internal device is utmostly required, so as to protect the internal device.

In a deep submicron semiconductor process, the ESD tolerance is getting worse as dimensions of the IC devices are getting miniaturized. Hence, the design for ESD protection has been taken into account when designing ICs. Usually the ESD tolerance for commercially available ICs is required to pass the human body model (HBM) test. In order to sustain the above-mentioned high-voltage ESD test, the large-scaled ESD protection device for ICs is usually applied.

SUMMARY OF THE INVENTION

Accordingly, the present invention is directed to an ESD protection device with enhanced ESD performance.

An ESD protection device of the present invention includes a P-body region, a P-type doped region, an N-type doped region and an N-sinker region. The P-body region is configured in a substrate. The P-type doped region is configured in the middle of the P-body region. The N-type doped region is configured in the P-body region and surrounds the P-type doped region. The N-sinker region is configured in the substrate and surrounds the P-body region.

According to an embodiment of the present invention, the ESD protection device further includes an N-epitaxial layer disposed between the P-body and the N-sinker region, wherein a spacing is deployed between the N-type doped region and the N-epitaxial layer. The spacing may be greater than a depth difference between the N-type doped region and the P-body region.

According to an embodiment of the present invention, the ESD protection device further includes an isolation structure disposed between the P-body and the N-sinker region.

According to an embodiment of the present invention, the P-type doped region and the P-body region are shaped as symmetrical polygonal regions, while the N-type doped region and the N-sinker region are shaped as symmetrical polygonal ring regions concentrically to the polygonal regions. The symmetrical polygonal regions can be rectangular, and the symmetrical polygonal ring regions can be rectangular. Alternatively, the symmetrical polygonal regions may be octagonal, and the symmetrical polygonal ring regions may be octagonal.

According to an embodiment of the present invention, the P-type doped region and the P-body region are shaped as circular regions, while the N-type doped region and the N-sinker region are shaped as circular ring regions concentrically to the circular regions.

According to an embodiment of the present invention, the P-type doped region and the N-type doped region are heavily doped regions.

According to an embodiment of the present invention, the N-type doped region is coupled to an emitter terminal, the N-sinker region is coupled to a collector terminal, and the P-type doped region is coupled to a base terminal.

Another ESD protection device of the present invention includes a P-body region, a base/emitter structure, an N-sinker region and an isolation structure. The P-body region is configured in a substrate. The base/emitter structure is configured in the P-body region. The N-sinker region is configured in the substrate and surrounds the P-body region. The isolation structure is disposed between the P-body and the N-sinker region, wherein a spacing is deployed between the base/emitter structure and the isolation structure.

According to an embodiment of the present invention, the base/emitter structure includes a P-type doped region configured in the middle of the P-body region, and an N-type doped region configured in the P-body region and surrounding the P-type doped region. The P-type doped region and the N-type doped region can be heavily doped regions.

According to an embodiment of the present invention, the P-type doped region and the P-body region are shaped as symmetrical polygonal regions, while the N-type doped region and the N-sinker region are shaped as symmetrical polygonal ring regions concentrically to the polygonal regions. The symmetrical polygonal regions can be rectangular, and the symmetrical polygonal ring regions can be rectangular. Alternatively, the symmetrical polygonal regions may be octagonal, and the symmetrical polygonal ring regions may be octagonal.

According to an embodiment of the present invention, the P-type doped region and the P-body region are shaped as circular regions, while the N-type doped region and the N-sinker region are shaped as circular ring regions concentrically to the circular regions.

According to an embodiment of the present invention, the N-type doped region is coupled to an emitter terminal, the N-sinker region is coupled to a collector terminal, and the P-type doped region is coupled to a base terminal.

According to an embodiment of the present invention, the spacing is greater than a depth difference between the base/emitter structure and the P-body region.

According to an embodiment of the present invention, the ESD protection device further includes an N-epitaxial layer disposed between the P-body and the N-sinker region.

As mentioned above, the ESD protection device in the present invention utilizes bipolar junction transistors (BJTs) to achieve ESD protection, and therefore, the parasitic BJT can turn on to bypass the ESD current. Hence, the ESD performance can be improved effectively without compromising the layout area of the ESD protection device.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
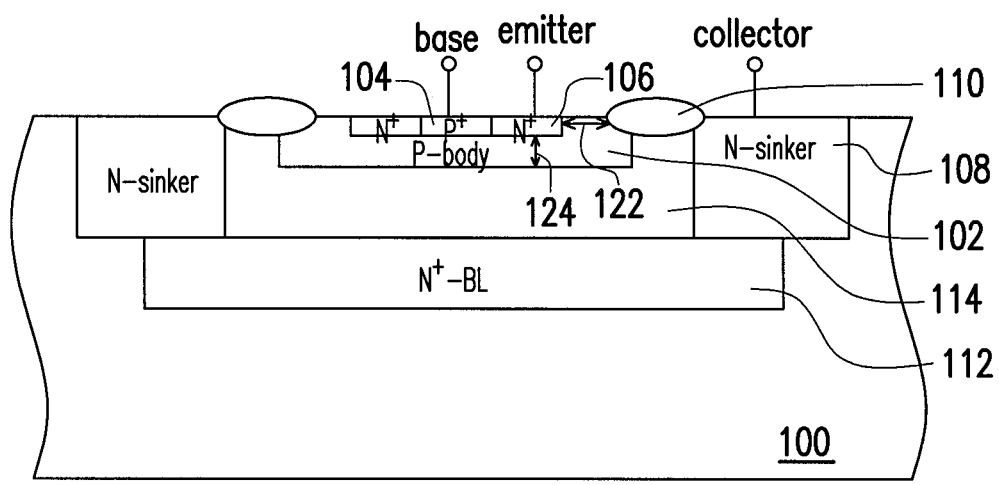
FIG. 1A depicts schematically, in a cross-sectional diagram, the ESD protection device according to the first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
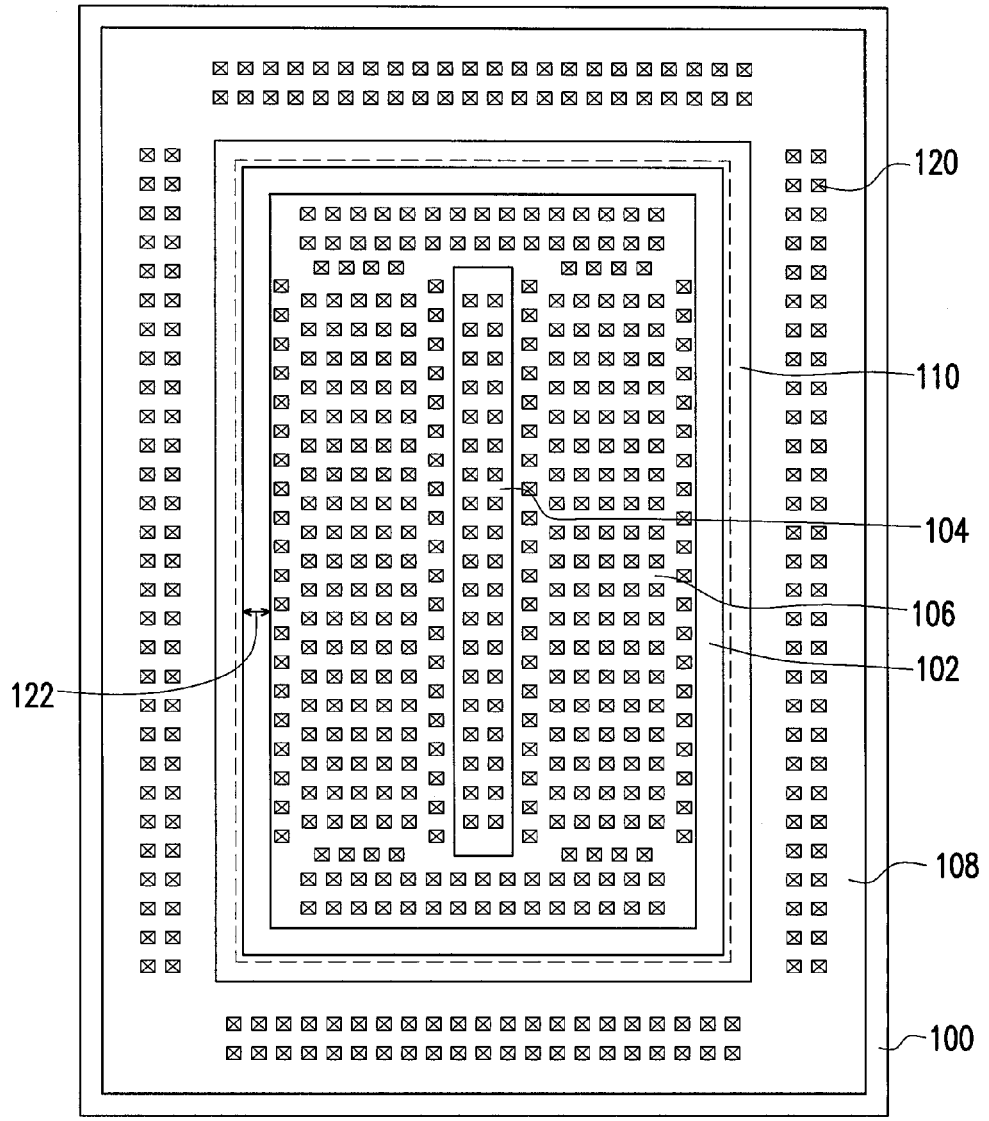
FIG. 1B schematically illustrates a top view layout of the ESD protection device according to an example in the first embodiment of the present invention.

The ESD protection device according to embodiments of the present invention is illustrated with schematic top views and cross-sectional diagrams hereinafter. FIG. 1A depicts schematically, in a cross-sectional diagram, the ESD protection device according to the first embodiment of the present invention. FIG. 1B schematically illustrates a top view layout of the ESD protection device according to an example in the first embodiment of the present invention.

Referring concurrently to FIGS. 1A and 1B, the ESD protection device of the first embodiment is deployed in a substrate 100. The substrate 100 is, for example, a P-type substrate, and an N-epitaxial layer 114 may be configured therein. The ESD protection device includes a P-body region 102, a P-type doped region 104, an N-type doped region 106, an N-sinker region 108, an N-buried layer 112 and an isolation structure 110.

The P-body region 102 is configured in the substrate 100 within the N-epitaxial layer 114. The P-type doped region 104, such as a P$^+$ doped region, is configured in the P-body region 102. The P-type doped region 104 can be deployed in the middle of the P-body region 102. The N-type doped region 106, such as an N$^+$ doped region, is configured in the P-body region 102 and surrounds the P-type doped region 104. The N-type doped region 106 may adjoin the profile of the P-type doped region 104. The P-type doped region 104 and the N-type doped region 106, for example, constitute a portion of the exposed upper surface within the P-body region 102. The N-sinker region 108 is configured in the substrate 100, and may encircle the N-epitaxial layer 114. The N-sinker region 108 can be designed in the form of a frame, and surrounds the P-body region 102. The N-buried layer 112, such as an N$^+$ buried layer designated as N$^+$-BL in FIG. 1A, is configured in the substrate 100 and under the P-body region 102. The N-buried layer 112 connects with the N-sinker region 108. In an embodiment, the N-buried layer 112 is deployed underneath the N-epitaxial layer 114, such that the N-epitaxial layer 114 is deployed between the P-body region 102 and the N-buried layer 112, and the N-sinker region 108 extends from the deep N-buried layer 112 to the upper surface of the substrate 100.

The isolation structure 110 is disposed between P-body region 102 and the N-sinker region 108. The isolation structure 110 can be a field oxide (FOX) structure or a shallow trench isolation (STI) structure. The N-type doped region 106 and the isolation structure 110 are separated from each other, for example. In an embodiment, the isolation structure 110 encircles the profile of the P-body region 102, and a spacing 122 is deployed between the outward edge of the N-type doped region 106 and the isolation structure 110. It is noted that the spacing 122 is greater than a depth difference 124 between the N-type doped region 106 and the P-body region 102. That is to say, the lateral spacing 122 is greater than the vertical distance from the N-P junction to the bottom edge of the P-body region 102. In an example, when the P-body region 102 has a depth of about 0.9 μm and the N-type doped region 106 has a depth of about 0.2 μm, the spacing 122 can be defined as about 2 μm.

In an embodiment, the P-type doped region 104 and the P-body region 102 are shaped as symmetrical polygonal regions, while the N-type doped region 106 and the N-sinker region 108 are shaped as symmetrical polygonal ring regions concentrically to the polygonal regions. Taking the structure of FIG. 1B as an example, the P-body region 102 encompassing the P-type doped region 104 and the N-type doped region 106 therein is formed as a quadrilateral (e.g. a rectangle). The P-type doped region 104 is formed as a rectangle and located in the middle of the P-body region 102. The N-type doped region 106 concentrically encircling the P-type doped region 104 is shaped as a rectangular ring. The N-sinker region 108 surrounding the outside of the isolation structure 110 and forms a rectangular ring. From the top view layout shown in FIG. 1B, the P-body region 102 and the P-type doped region 104 are of the same shape (i.e. rectangle), while the N-sinker region 108 and the N-type doped region 106 are concentric rings of the identical rectangle shape.

As shown in FIG. 1B, contact plugs 120 may further be formed on the P-type doped region 104, the N-type doped region 106 and the N-sinker region 108, such that the P-type doped region 104, the N-type doped region 106 and the N-sinker region 108 can be electrically connected to respective terminals of a bipolar junction transistor (BJT). Referring to FIG. 1A again, in an embodiment, the N-type doped region 106 serves as an emitter. The P-type doped region 104 deployed in the central portion and coupled to the P-body region 102 connects to a base terminal. The N-sinker region 108 coupled to the N-buried layer 112 connects to a collector terminal to compass the base and the emitter therein. Accordingly, the combination of the N-type doped region 106, the P-body region 102 and the N-buried layer 112 forms a vertical NPN bipolar transistor, while the combination of the N-type doped region 106, the P-body region 102 and the N-sinker region 108 forms a lateral NPN bipolar transistor. Given that the ESD protection device can be considered to include the equivalent vertical NPN transistor in conjunction with the equivalent lateral NPN transistor, the parasitical BJT can be turned on to bypass the ESD current, such that the ESD performance can be enhanced effectively without compromising the layout area of the ESD protection device.

More specifically, once the high voltage of the ESD causes the base-collector junction breakdown and the lateral NPN transistor are turned on by the large bias current, the vertical NPN transistor can be turned on and the ESD currents can be discharged downward and evenly in four directions due to its symmetrical polygonal layout. Hence, the ESD currents can be quickly discharged by the ESD protection device described above. Not only the ESD protection device with the above layout structure can uniformly discharge the ESD currents, but also the compact layout of the ESD protection device affords smaller device sizes under the same ESD robustness. Furthermore, the parasitic capacitance of the ESD protection device can be effectively reduced and the ESD performance can be improved with smaller device sizes.

Furthermore, since the spacing 122 is offset between the outward edge of the N-type doped region 106 and the isolation structure 110, the base width of the BJT in the lateral direction can be increased and the surface bipolar beta gain can be reduced. The ESD current path is also feasible for the vertical NPN transistor.

Figure 2:
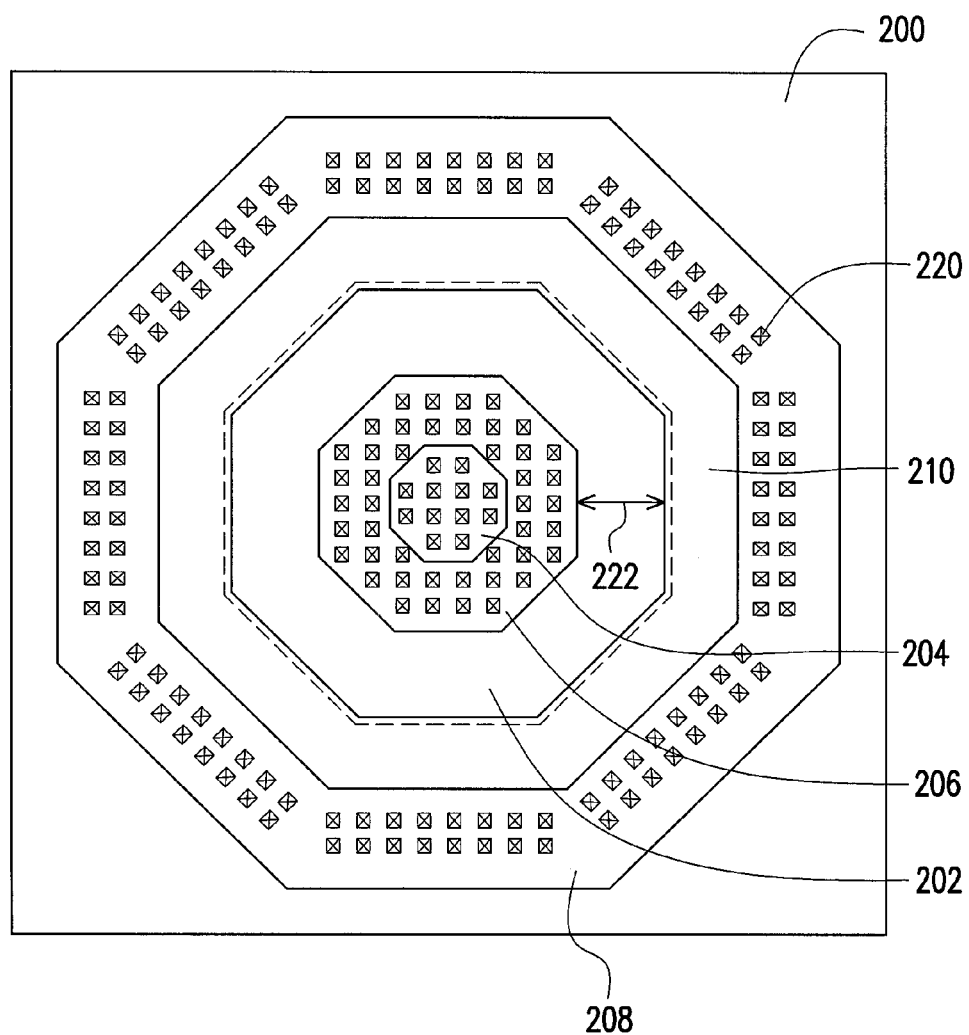
FIG. 2 schematically illustrates a top view layout of the ESD protection device according to another example in the first embodiment of the present invention.

It should be noted that the layout configuration in the example shown in FIG. 1B is provided for illustration purposes, and is not construed as limiting the scope of the present invention. It is appreciated by persons skilled in the art that the layout configuration can be other symmetrical polygonal shapes. FIG. 2 schematically illustrates a top view layout of the ESD protection device according to another example in the first embodiment of the present invention. The ESD protection of FIG. 2 has a similar cross-sectional structure to the structure shown in FIG. 1A, and will not be described herein in details.

Referring to FIG. 2, the ESD protection device is deployed in a substrate 200. The P-type doped region 204 is formed as an octagon and located in the middle of the octagonal P-body region 202. The N-type doped region 206 deployed in the P-body region 202 surrounds the P-type doped region 204, while the N-sinker region 208 encircles the outside of the isolation structure 210. From the top view layout of FIG. 2, the ESD protection device includes the octagonal P-body region 202, the octagonal P-type doped region 204 located in the middle of the P-body region 202, and octagonal ring-shaped N-sinker region 208 and N-type doped region 206 concentrically encircling the P-type doped region 204. That is to say, the P-body region 202 and the P-type doped region 204 are of the same shape (i.e. octagon), while the N-sinker region 208 and the N-type doped region 206 are shaped as concentric octagonal rings. In addition, contact plugs 220 may further be formed on the P-type doped region 204, the N-type doped region 206 and the N-sinker region 208, such that the P-type doped region 204, the N-type doped region 206 and the N-sinker region 208 can be electrically connected to respective terminals to form a BJT.

It is worthy to note that the ESD protection device with the octagonal layout structure can further improve the current spreading, as the ESD currents can be uniformly discharged in eight directions and downward. Moreover, the octagonal ESD protection device structure can further shrink down the device size and reduce the parasitic capacitance, so as to effectively enhance the ESD protection capability.

Figure 3:
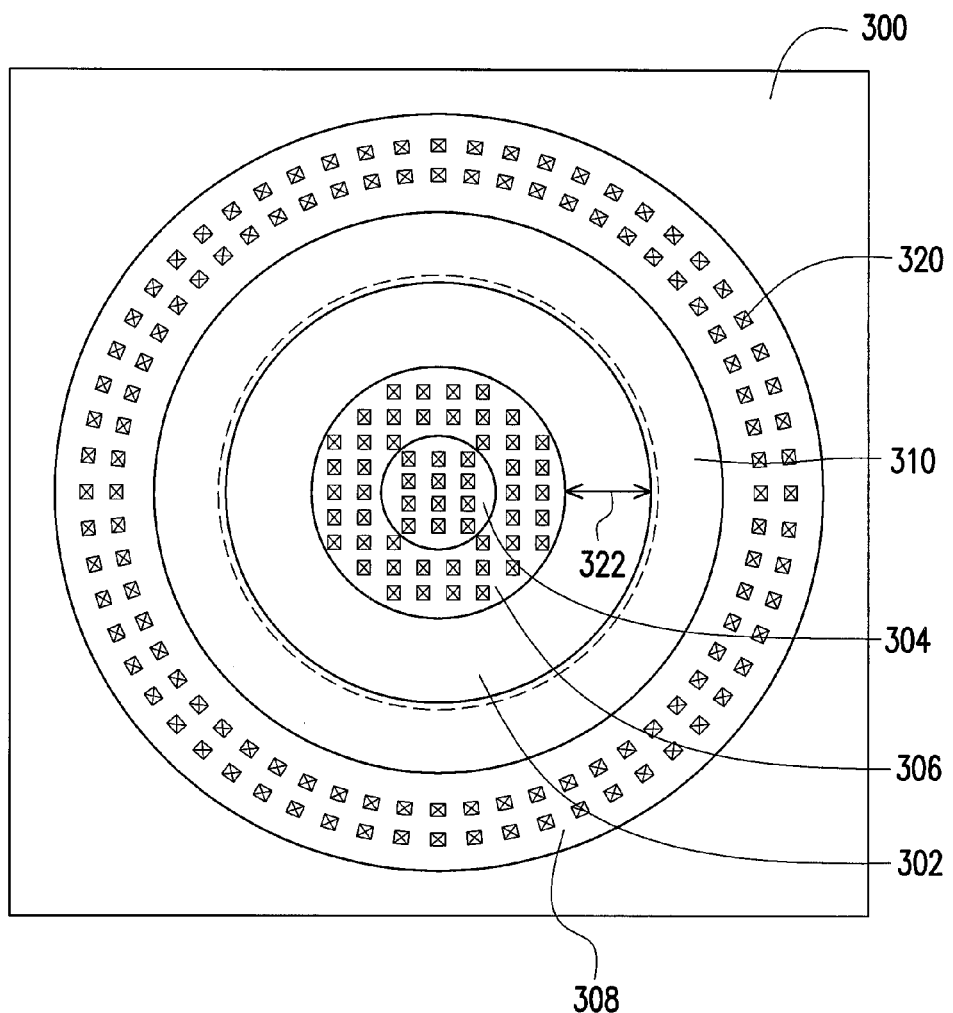
FIG. 3 schematically illustrates a top view layout of the ESD protection device according to still another example in the first embodiment of the present invention.

Furthermore, the design of the ESD protection device structure can be modified in order to further enhance the capability of the ESD protection device. FIG. 3 schematically illustrates a top view layout of the ESD protection device according to still another example in the first embodiment of the present invention. The ESD protection of FIG. 3 has a similar cross-sectional structure to the structure shown in FIG. 1A, and will not be described herein in details.

Referring to FIG. 3, in another embodiment, the ESD protection device deployed in a substrate 300 has a circular or round layout. That is to say, the P-type doped region 304 and the P-body region 302 are shaped as circular regions, while the N-type doped region 306 and the N-sinker region 308 are shaped as circular ring regions concentrically to the circular regions. The P-type doped region 304 is formed as round shape and located in the middle of the circular P-body region 302. The N-type doped region 306 deployed in the P-body region 302 surrounds the P-type doped region 304, while the N-sinker region 308 encircles the outside of the isolation structure 310. From the top view layout of FIG. 3, the ESD protection device includes the circular P-body region 302, the circular P-type doped region 304 located in the middle of the P-body region 302, and annular N-sinker region 308 and N-type doped region 306 concentrically encircling the P-type doped region 304. That is to say, the P-body region 302 and the P-type doped region 304 are of the same shape (i.e. circle), while the N-sinker region 308 and the N-type doped region 306 are concentric rings of the round shape. In addition, contact plugs 320 may further be formed on the P-type doped region 304, the N-type doped region 306 and the N-sinker region 308, such that the P-type doped region 304, the N-type doped region 306 and the N-sinker region 308 can be electrically connected to respective terminals to form a BJT.

Likewise, the ESD protection device with the circular layout structure can further enhance the current spreading, as the ESD currents can be uniformly discharged downward and in all directions without encountering any angles. The circular ESD protection device also provides more uniform current paths and a smaller device size with the reduced parasitic capacitance. Therefore, the ESD protection device with circular structure can further improve the ESD performance.

FIGS. 1B, 2 and 3 are illustrated only as simplified exemplary examples in terms of several layouts of the ESD protection devices, and should not be adopted for limiting the scope of the present invention. The layout of the ESD protection device can be designed as other symmetrical polygonal shapes, such as tetragonal, hexagonal, dodecagonal or dioctagonal. The layout arrangement of the device is not particularly limited by the present invention.

Figure 4:
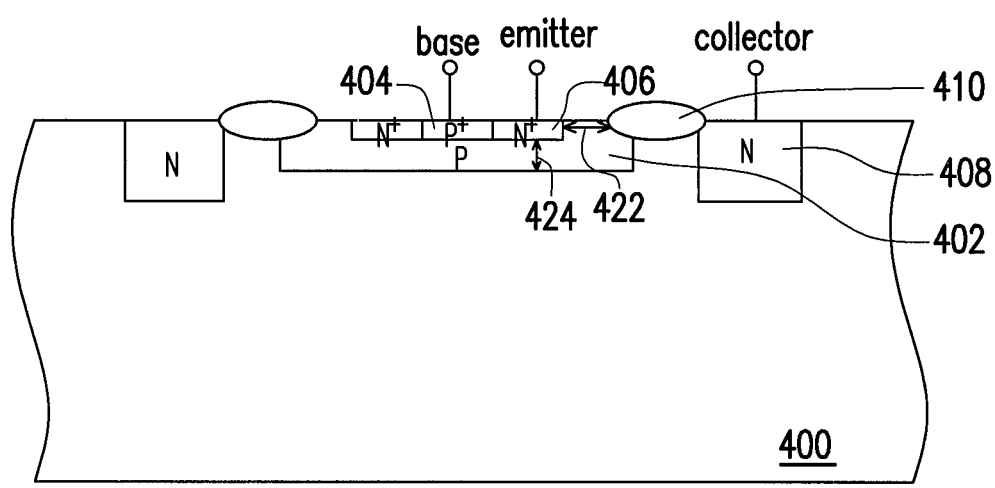
FIG. 4 depicts schematically, in a cross-sectional diagram, the ESD protection device according to the second embodiment of the present invention.

Alternatively, the ESD protection device can be further modified so as to apply to other semiconductor processes. FIG. 4 depicts schematically, in a cross-sectional diagram, the ESD protection device according to the second embodiment of the present invention.

Referring to FIG. 4, the ESD protection device of the second embodiment is deployed in a substrate 400, such as a P-type substrate or a deep N-well region. The ESD protection device includes a first P-type doped region 402, a second P-type doped region 404, a first N-type doped region 406, a second N-type doped region 408 and an isolation structure 410.

The first P-type doped region 402 is configured in the substrate 400. The second P-type doped region 404, such as a P$^+$ doped region, is configured in the first P-type doped region 402. The second P-type doped region 404 can be deployed in the middle of the first P-type doped region 402. The first N-type doped region 406, such as an N$^+$ doped region, is configured in the first P-type doped region 402 and surrounds the second P-type doped region 404. The first N-type doped region 406 may adjoin the profile of the second P-type doped region 404. The second P-type doped region 404 and the first N-type doped region 406, for example, constitute a portion of the exposed upper surface within the first P-type doped region 402. The second N-type doped region 408 is configured in the substrate 400. The second N-type doped region 408 can be designed in the form of a frame, and surrounds the first P-type doped region 402.

The isolation structure 410 is disposed between first P-type doped region 402 and the second N-type doped region 408. The isolation structure 410 can be a field oxide (FOX) structure or a shallow trench isolation (STI) structure. The first N-type doped region 406 and the isolation structure 410 are separated from each other, for example. In an embodiment, the isolation structure 410 encircles the profile of the first P-type doped region 402, and a spacing 422 is deployed between the outward edge of the first N-type doped region 406 and the isolation structure 410. It is noted that the spacing 422 is greater than a depth difference 424 between the first N-type doped region 406 and the first P-type doped region 402. That is to say, the lateral spacing 422 is greater than the vertical distance from the N-P junction to the bottom edge of the first P-type doped region 402. In an example, when the first P-type doped region 402 has a depth of about 0.9 μm and the first N-type doped region 406 has a depth of about 0.2 μm, the spacing 422 can be defined as about 2 μm.

In an embodiment, the first N-type doped region 406 serves as an emitter. The second P-type doped region 404 deployed in the central portion and coupled to the first P-type doped region 402 connects to a base terminal. The second N-type doped region 408 encircling the first P-type doped region 402 connects to a collector terminal. Accordingly, the ESD protection device can be considered to include an equivalent lateral NPN bipolar transistor. Since the lateral BJT can be turned on to bypass the ESD current, the ESD current can be discharged evenly and quickly in all lateral directions. Hence, the ESD performance can be enhanced effectively without increasing the layout area of the ESD protection device.

The top view layout of the ESD protection device can be designed as the layout structure depicted in the foregoing examples of the first embodiment, but is not particularly limited by the present invention. For instance, the first P-type doped region 402 and the second P-type doped region 404 can be shaped as symmetrical polygonal (e.g. rectangular or octagonal) regions, while the first N-type doped region 406 and second N-type doped region 408 can be shaped as symmetrical polygonal ring regions concentrically to the respective polygonal regions, as shown respectively in FIG. 1B and FIG. 2. Alternatively, the first P-type doped region 402 and the second P-type doped region 404 may be shaped as circular regions, while the first N-type doped region 406 and second N-type doped region 408 may be shaped as annular regions concentrically to the circular regions, as shown in FIG. 3.

The following is provided to prove that the ESD protection device in the present invention can enhance the ESD performance. The ESD protection device of the present invention is compared with the conventional ESD protection device. These examples are provided to illustrate electrical relation diagrams upon measurement and the testing results of the human body model (HBM), but are not intended to limit the scope of the present invention.

Figure 5A:
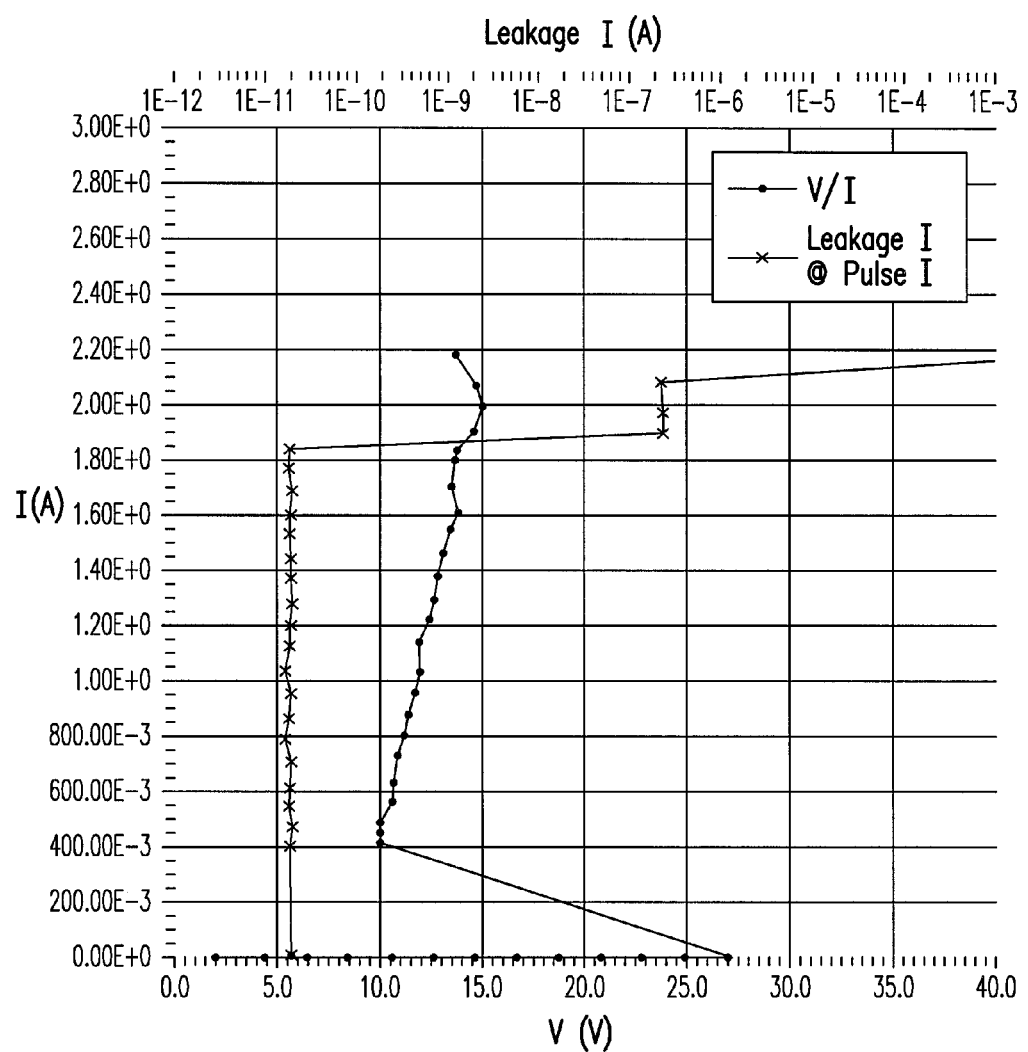
FIG. 5A schematically illustrates an electrical relation diagram of the ESD protection device of the present invention as shown in FIG. 1B, which is measured by a transmission line pulsing system (TLP system).
Figure 5B:
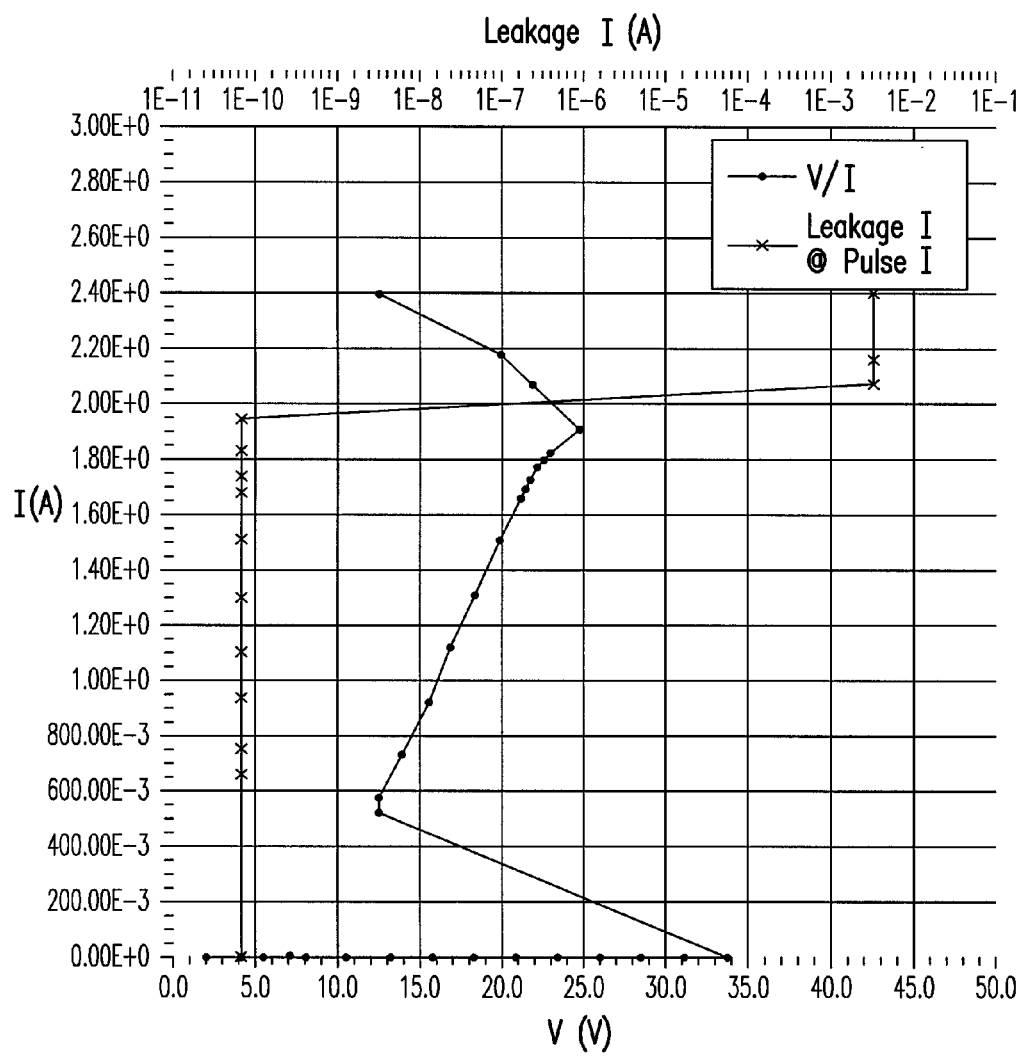
FIG. 5B schematically illustrates an electrical relation diagram of the ESD protection device of the present invention as shown in FIG. 2, which is measured by the TLP system.
Figure 5C:
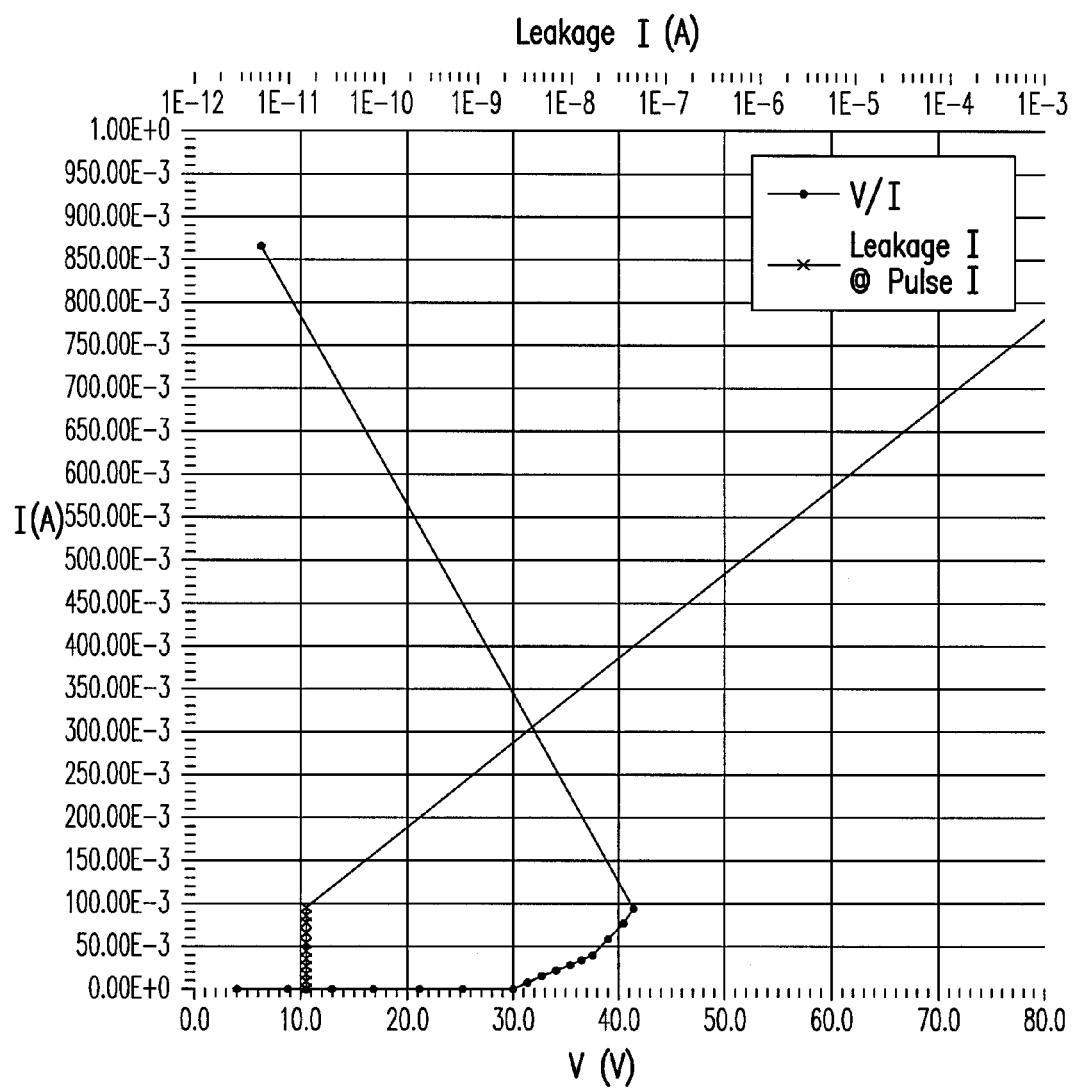
FIG. 5C schematically illustrates an electrical relation diagram of the conventional ESD protection device, which is measured by the TLP system.

FIG. 5A schematically illustrates an electrical relation diagram of the ESD protection device of the present invention as shown in FIG. 1B, which is measured by a transmission line pulsing system (TLP system). FIG. 5B schematically illustrates an electrical relation diagram of the ESD protection device of the present invention as shown in FIG. 2, which is measured by the TLP system. FIG. 5C schematically illustrates an electrical relation diagram of the conventional ESD protection device, which is measured by the TLP system.

As shown in FIGS. 5A and 5B, the proposed ESD protection devices of the present invention can sustain the current of about 1.8 A and 1.95 A, and the trigger voltage thereof is about 27 V and 35 V, respectively. Since the ESD protection devices of the present invention includes the equivalent vertical NPN transistor in conjunction with the equivalent lateral NPN transistor, the ESD current can be bypassed effectively due to the parasitical BJT turn-on.

As shown in FIG. 5C, the conventional ESD protection device can merely sustain the current of about 100 mA. As compared with the ESD protection devices described in the present invention, the conventional ESD protection device bypasses the ESD current just by the N-P junction breakdown, rather than the parasitic BJT turn-on.

Table 1 is the testing results of the HBM test respectively applied to the ESD protection devices of the present invention as shown in FIGS. 1B and 2 and the conventional device.

TABLE 1

| | ESD protection device in FIG. 1B | ESD protection device in FIG. 2 | Conventional device |
|---|---|---|---|
| HBM test (V) | 2500 | 3000 | 400 |

Referring to Table 1, the testing results of the HBM test of each ESD protection device of the present invention is much greater than that of the conventional ESD protection device.

Comparing FIGS. 5A-5C and Table 1, it is found that the proposed ESD protection device structure can bear the higher ESD current to the ESD robustness than the conventional ESD protection device, and thereby the ESD performance of the present invention is promised.

In view of the above, the proposed ESD protection device of the embodiments in the present invention can discharge ESD currents in multiple directions and greatly improve the discharge capacity due to the parasitical BJT turn-on. Owing to the symmetrical polygonal design or circular design as described in the foregoing examples, such compact ESD protection device occupies much less area and thus reduces the parasitic capacitance without compromising the ESD robustness.

Further, the ESD protection device of the present invention can be in general compatible with the current semiconductor processes, e.g. CMOS process or Epi process, through slight modifications, so as to simplify the fabrication process without raising the cost. Hence, not only the ESD performance can be improved, but the process is simple.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection device, comprising:
 a P-body region, configured in a substrate;
 a P-type doped region, configured in the middle of the P-body region;
 an N-type doped region, configured in the P-body region and surrounding the P-type doped region; and an N-sinker region, configured in the substrate and surrounding the P-body region, wherein the N-type doped region is coupled to an emitter terminal, and the P-type doped region is coupled to a base terminal.

2. The ESD protection device according to claim 1, further comprising an N-epitaxial layer, disposed between the P-body and the N-sinker region, wherein a spacing is deployed between the N-type doped region and the N-epitaxial layer.

3. The ESD protection device according to claim 2, wherein the spacing is greater than a depth difference between the N-type doped region and the P-body region.

4. The ESD protection device according to claim 1, further comprising an isolation structure, disposed between the P-body and the N-sinker region.

5. The ESD protection device according to claim 1, wherein the P-type doped region and the P-body region are shaped as symmetrical polygonal regions, while the N-type doped region and the N-sinker region are shaped as symmetrical polygonal ring regions concentrically to the polygonal regions.

6. The ESD protection device according to claim 5, wherein the symmetrical polygonal regions are rectangular and the symmetrical polygonal ring regions are rectangular.

7. The ESD protection device according to claim 5, wherein the symmetrical polygonal regions are octagonal and the symmetrical polygonal ring regions are octagonal.

8. The ESD protection device according to claim 1, wherein the P-type doped region and the P-body region are shaped as circular regions, while the N-type doped region and the N-sinker region are shaped as circular ring regions concentrically to the circular regions.

9. The ESD protection device according to claim 1, wherein the P-type doped region and the N-type doped region are heavily doped regions.

10. The ESD protection device according to claim 1, wherein the N-sinker region is coupled to a collector terminal.

11. An electrostatic discharge (ESD) protection device, comprising:
a P-body region, configured in a substrate;
a base structure and a emitter structure, configured in the P-body region, and the base structure configured within the emitter structure;
an N-sinker region, configured in the substrate and surrounding the P-body region; and
an isolation structure, disposed between the P-body and the N-sinker region,
wherein a spacing is deployed between the emitter structure and the isolation structure.

12. The ESD protection device according to claim 11, wherein
the base structure comprises a P-type doped region, configured in the middle of the P-body region; and
the emitter structure comprises an N-type doped region, configured in the P-body region and surrounding the P-type doped region.

13. The ESD protection device according to claim 12, wherein the P-type doped region and the P-body region are shaped as symmetrical polygonal regions, while the N-type doped region and the N-sinker region are shaped as symmetrical polygonal ring regions concentrically to the polygonal regions.

14. The ESD protection device according to claim 13, wherein the symmetrical polygonal regions are rectangular and the symmetrical polygonal ring regions are rectangular.

15. The ESD protection device according to claim 13, wherein the symmetrical polygonal regions are octagonal and the symmetrical polygonal ring regions are octagonal.

16. The ESD protection device according to claim 12, wherein the P-type doped region and the P-body region are shaped as circular regions, while the N-type doped region and the N-sinker region are shaped as circular ring regions concentrically to the circular regions.

17. The ESD protection device according to claim 12, wherein the P-type doped region and the N-type doped region are heavily doped regions.

18. The ESD protection device according to claim 12, wherein the N-type doped region is coupled to an emitter terminal, the N-sinker region is coupled to a collector terminal, and the P-type doped region is coupled to a base terminal.

19. The ESD protection device according to claim 11, wherein the spacing is greater than a depth difference between the emitter structure and the P-body region.

20. The ESD protection device according to claim 11, further comprising an N-epitaxial layer, disposed between the P-body and the N-sinker region.

* * * * *